US011838010B2

(12) United States Patent
Huang

(10) Patent No.: US 11,838,010 B2
(45) Date of Patent: Dec. 5, 2023

(54) POWER SUPPLY CIRCUIT WITH ADJUSTABLE CHANNEL SWITCH IMPEDANCE AND ELECTRONIC DEVICE

(71) Applicant: SHANGHAI YAOHUO MICROELECTRONICS Co., Ltd., Shanghai (CN)

(72) Inventor: Lei Huang, Beijing (CN)

(73) Assignee: SHANGHAI YAOHUO MICROELECTRONICS Co., Ltd., Shanghai (CN)

( * ) Notice: Subject to any disclaimer, the term of this patent is extended or adjusted under 35 U.S.C. 154(b) by 266 days.

(21) Appl. No.: 17/375,989

(22) Filed: Jul. 14, 2021

(65) Prior Publication Data
US 2023/0014177 A1 Jan. 19, 2023

(51) Int. Cl.
H03K 17/08 (2006.01)
H03K 17/082 (2006.01)
H02H 9/02 (2006.01)
H02M 1/32 (2007.01)
H02M 3/158 (2006.01)

(52) U.S. Cl.
CPC ......... H03K 17/0822 (2013.01); H02H 9/02 (2013.01); H02M 1/32 (2013.01); H02M 3/158 (2013.01); H03K 2217/0081 (2013.01)

(58) Field of Classification Search
CPC ...... H03K 17/0822; H03K 2217/0081; H02M 1/32; H02M 3/158; H02H 9/02
See application file for complete search history.

(56) References Cited

U.S. PATENT DOCUMENTS

2006/0012932 A1   1/2006  Kitagawa
2018/0358816 A1*  12/2018 Kondo ............. H02J 7/007182
2022/0397928 A1*  12/2022 Hermann ............... G01R 27/14

FOREIGN PATENT DOCUMENTS

CN         1722560         1/2006

OTHER PUBLICATIONS

English translation of First Office Action from corresponding CN application No. 2020103489852 dated Oct. 9, 2020.

* cited by examiner

Primary Examiner — Rafael O De Leon Domenech
(74) Attorney, Agent, or Firm — NZ CARR LAW OFFICE PLLC

(57) ABSTRACT

The present invention provides a power supply circuit with an adjustable channel switch impedance and an electronic device. The power supply circuit includes N main channel MOS transistors, a control module, an execution module and a detection module, wherein the execution module includes a first MOS transistor; the detection module includes a detection resistor and a second MOS transistor; a gate-source voltage of the main channel MOS transistors and a gate-source voltage of the first MOS transistor are configured to be consistent, and a source-drain voltage of the main channel MOS transistors and a source-drain voltage of the second MOS transistor are consistent; the control module is connected to the detection resistor and configured to: detect voltage drop information on voltage drop at two ends of the detection resistor, wherein the voltage drop information can represent a current of a load.

20 Claims, 6 Drawing Sheets

POWER SUPPLY CIRCUIT WITH ADJUSTABLE CHANNEL SWITCH IMPEDANCE AND ELECTRONIC DEVICE

TECHNICAL FIELD

The present invention relates to a power supply circuit, in particular to a power supply circuit with an adjustable channel switch impedance and an electronic device.

BACKGROUND

In a power supply circuit of an electronic device, a main current channel can be adjusted through on-off control on switch devices therein. The power supply circuit can be applied to a power output side or a power input side of the electronic device.

In existing related technologies, a detection resistor and an MOS transistor for controlling on-off of the main current channel can be connected in series in the main current channel, so that a current of the main current channel can be determined based on the voltage of the detection resistor; however, this solution may increase a heat loss of the main current channel considering the voltage drop on the detection resistor; and when the current is relatively small, because the voltage drop of the detection resistor is relatively small, it is difficult to accurately detect the current, and the current cannot be accurately detected and controlled in time. Meanwhile, the existing circuit can only achieve on-off control on the channel, and has difficulty in meeting various circuit requirements as a result of single control means.

SUMMARY

The present invention provides a power supply circuit with an adjustable channel switch impedance and an electronic device, which aim to solve the problems of heat loss, single control means and difficulty in meeting various circuit requirements.

According to a first aspect of the present invention, the present invention provides a power supply circuit with an adjustable channel switch impedance, including N main channel MOS transistors, a control module, an execution module and a detection module, wherein N is an integer greater than or equal to 1; the execution module includes a first MOS transistor; the detection module includes a detection resistor and a second MOS transistor;

both the first end of the second MOS transistor and the first ends of the main channel MOS transistors are connected to a first power supply, and the second ends of the main channel MOS transistors are grounded through a load; the second end of the second MOS transistor is directly or indirectly grounded through the detection resistor; a gate of the second MOS transistor and gates of the main channel MOS transistors are connected to the same circuit position, the first MOS transistor is directly or indirectly connected between an execution side power supply and the ground, and the execution side power supply is a first power supply or a second power supply which is different from the first power supply;

a gate-source voltage of the main channel MOS transistors and a gate-source voltage of first MOS transistor are configured to be consistent, and a voltage between the gates of the main channel MOS transistors and the second end and a voltage between the gate of the second MOS transistors and the second end are consistent, and parameters of the main channel MOS transistors, the first MOS transistor and the second MOS transistor are the same; and the control module is connected to the detection resistor and configured to:

detect voltage drop information which can characterize a current of a load at two ends of the detection resistor; and adjust the current between a source and a drain of the first MOS transistor according to the voltage drop information so as to adjust a drain-source voltage of the first MOS transistor, so that the gate-source voltage of the main channel MOS transistors changes accordingly, and the impedance formed by the N main channel MOS transistors is adjusted accordingly.

Optionally, the execution module further includes a first keeping unit which is connected to the drain of the first MOS transistor and is configured to control the drain of the first MOS transistor to be kept at a first reference voltage.

Optionally, the first keeping unit includes a first current source;

the first current source is connected between the execution side power supply and the ground after being connected in series with the first MOS transistor, and the first current source is further connected to the drain of the first MOS transistor; and the control end of the first current source is further connected to the control module; and the control module is specially configured to adjust a current of the first current source when adjusting a current between the source and the drain of the first MOS transistor.

Optionally, the first keeping unit includes a first operational amplifier, the first input end of the first operational amplifier is connected to the drain of the first MOS transistor and the second input end of the first operational amplifier is accessed into the first reference voltage; and the output end of the first operational amplifier is connected to the gate of the first MOS transistor, so as to keep the voltage at the drain of the first MOS transistor at the first reference voltage through control on the first MOS transistor.

Optionally, the first keeping unit further includes a second current source and a reference resistor; the second current source is connected between the execution side power supply and the ground after being connected in series to the reference resistor; and the second input end of the first operational amplifier is connected between the second current source and the reference resistor, so as to acquire a voltage of a potential between the second current source and the reference resistor as the first reference voltage.

Optionally, the control module is specially configured to adjust the first reference voltage when adjusting a current between the source and the drain of the first MOS transistor.

When adjusting the first reference voltage, the control module is specifically configured to adjust one of the following: a resistance value of the reference resistor, current of the second current source and the voltage of the potential between the second current source and the reference resistor;

When adjusting the first reference voltage, the control module is specifically configured to adjust one of the following: a resistance value of the reference resistor, current of the second current source and the voltage of the potential between the second current source and the reference resistor;

Optionally, the main channel MOS transistors and the first MOS transistor are PMOS, the execution side power supply is the first power supply, the drain of the first MOS transistor is directly or indirectly grounded, the first ends of the main channel MOS transistors are sources of the main channel MOS transistors, and the second ends of the main channel MOS transistors are drains of the main channel MOS transistors.

Optionally, the main channel MOS transistors and the first MOS transistor are NMOS, the first ends of the main channel MOS transistors are drains of the main channel MOS transistors, the second ends of the main channel MOS transistors are sources of the main channel MOS transistors, the drain of the first MOS transistor is connected to the execution side power supply, and the source of the first MOS transistor is directly or indirectly grounded.

Optionally, the execution module further includes a source-grate voltage replication unit;

the two ends of the first side of the gate-source voltage replication unit are connected to the source and the gate of the first MOS transistor respectively, and the voltage at the two ends of the second side of the gate-source voltage replication unit is consistent with the gate-source voltage of the main channel MOS transistors;

the gate-source voltage replication unit is configured such that the voltage at the two ends of the first side of the gate-source voltage replication unit can be consistent with the voltage at the two ends of the second side thereof, so that the gate-source voltage of the first MOS transistor is consistent with the gate-source voltage of the main channel MOS transistors.

Optionally, the detection module further includes a second keeping unit, the second keeping unit is configured to control the voltage at the second end of the second MOS transistor to be consistent with the voltage at the second ends of the main channel MOS transistors.

Optionally, the third MOS transistor is connected in series between the second end of the second MOS transistor and the detection resistor or between the detection resistor and the ground; the two input ends of the second operational amplifier are connected to the second end of the second MOS transistor and the second ends of the main channel MOS transistors respectively; the output end of the second operational amplifier is connected to the gate of the third MOS transistor, so as to keep the voltage at the second end of the second MOS transistor consistent with the voltage at the second ends of the main channel MOS transistors through control on the third MOS transistor.

Optionally, when adjusting the current between a source and a drain of the first MOS transistor according to the voltage drop information so as to adjust a drain-source voltage of the first MOS transistor, so that the gate-source voltage of the main channel MOS transistors changes accordingly, and the impedance formed by the N main channel MOS transistors is adjusted accordingly, the control module is specifically configured to:

determine a current of the load according to the voltage drop information; and adjust, according to a present current range of the current of the load as well as a corresponding relationship between different current ranges and different impedances of the main channel MOS transistors, the current between the source and the drain of the first MOS transistor, so that the impedance of the main channel MOS transistors is at the impedance corresponding to the present current range; and the corresponding relationship meets at least one of the following:

the impedances of the main channel MOS transistors corresponding to an over-current protection current range are impedances when the main channel MOS transistors are switched off, and the over-current protection current range refers to a current range greater than an over-current protection point;

for at least part of the current range, a smaller lower limit value of the current range means greater impedances of the main channel MOS transistors; and for at least part of the current range, a smaller upper limit value of the current range means greater impedances of the main channel MOS transistors.

According to a second aspect of the present invention, the present invention provides an electronic device including the power supply circuit with an adjustable channel switch impedance involved in the first aspect and the optional embodiments.

In the power supply circuit with an adjustable channel switch impedance and the electronic device provided by the present invention, because the main channel MOS transistors and the second MOS transistor with the same parameters are configured to have the same source-drain voltage, and the gates are connected together, it can be guaranteed that the voltage of the detection resistor is matched with the current of the load, so as to determine the load current without connecting the detection resistor to a main channel in series. It can be seen that in the present invention, the detection resistor can be prevented from being arranged in the main channel, so that a heat loss of the main channel is effectively reduced.

Meanwhile, the main MOS transistors and the first MOS transistor with the same parameters are configured to have the same gate-source voltage, the control module adjusts the source-drain current of the first MOS transistor to achieve the adjustment of impedance of the first MOS transistor, so that the impedance formed by the N main channel MOS transistors can be adjusted; the impedance of the main channel can be adjusted to meet various circuit requirements, for example, switch-off of the main channel, increase and decrease of the impedance; furthermore, based on a mechanism of main channel impedance adjustment, a condition is avoided that the detection resistor with a fixed resistance value cannot accurately detect when the current is relatively small, thereby facilitating improvement of current detection precision. Furthermore, based on the mechanism of main channel impedance adjustment, the optional embodiments of the present invention can be used for achieving effective control on a heat loss of the main channel in addition to switch-off control when over-current occurs, so as to achieve a lower heat loss and keep the voltage of the main channel MOS transistors within a reasonable range to achieve better current detection precision.

BRIEF DESCRIPTION OF THE DRAWINGS

To explain the embodiments of the present invention or the technical solutions in the prior art more clearly, the following will briefly introduce the drawings that need to be used in the description of the embodiments or the prior art. Obviously, the drawings in the following description show only some embodiments of the present invention. For those of ordinary skill in the art, other drawings can be obtained based on these drawings without inventive efforts.

Figure 1:
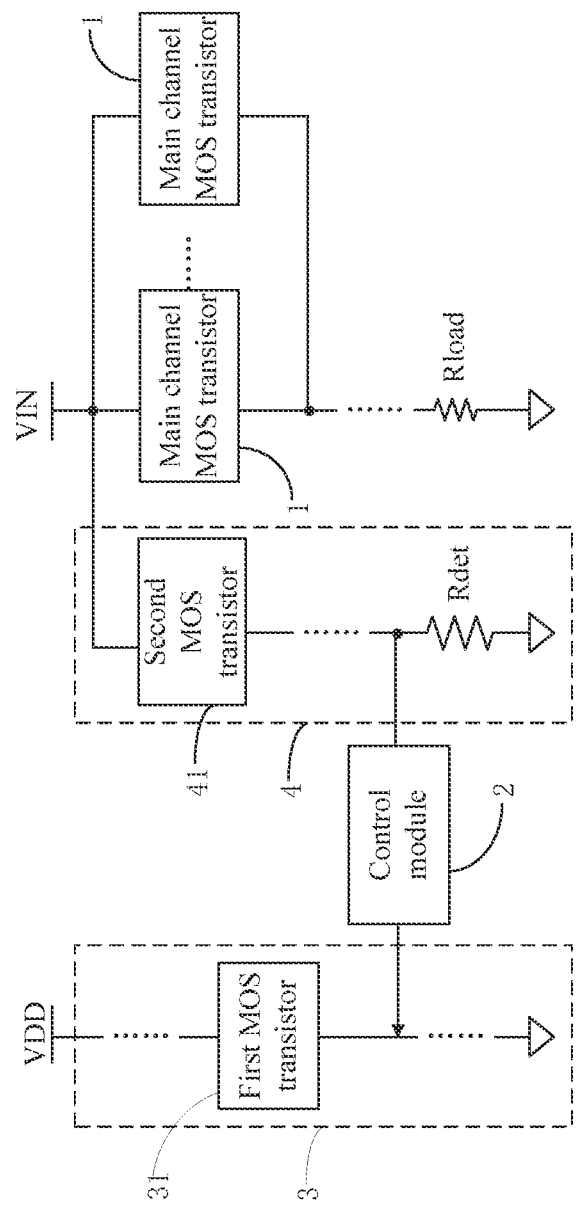
FIG. 1 is a schematic structural diagram I of a power supply circuit with an adjustable channel switch impedance in an embodiment of the present invention.

DESCRIPTION OF REFERENCE NUMERALS 1. main channel MOS transistor;
2. control module;
3. execution module;
31. first MOS transistor;
32. first current source;
33. first keeping unit;
331. second current source;
34. gate-source voltage replication unit;
4. detection module;
41. second MOS transistor;
42. second keeping unit;
421. third MOS transistor;
Rload. load;
Rdet. detection resistor;
Rref. reference resistor;
AMP1. first operational amplifier;
AMP2. second operational amplifier;
Pr. first MOS transistor;
Pc. second MOS transistor;
P1, . . . , Pn. main channel MOS transistor;
Pd. third MOS transistor;
Nr. first MOS transistor;
Nc. second MOS transistor;
N1, . . . , Nn. main channel MOS transistor.

DETAILED DESCRIPTION OF THE EMBODIMENTS

The technical solutions in the embodiments of the present invention will be clearly and completely described below in conjunction with the accompanying drawings in the embodiments of the present invention. Obviously, the described embodiments are only some embodiments of the present invention, rather than all the embodiments. Based on the embodiments of the present invention, all other embodiments obtained by those of ordinary skill in the art without inventive efforts shall fall within the protection scope of the present invention.

The terms "first", "second", "third", "fourth", etc. (if any) in the description and claims of the present invention and the above-mentioned drawings are used to distinguish similar objects, and are not necessarily used to describe a specific order or sequence. It should be understood that the data used in this way can be interchanged under appropriate circumstances so that the embodiments of the present invention described herein can be implemented in an order other than those illustrated or described herein. In addition, the terms "including" and "having" and any variations thereof are intended to cover non-exclusive inclusions. For example, a process, method, system, product, or device that includes a series of steps or units is not necessarily limited to the clearly listed steps or units, but may include other steps or units that are not clearly listed or are inherent to these processes, methods, products, or devices.

The technical solution of the present invention will be described in detail below with specific embodiments. The following specific embodiments can be combined with each other, and the same or similar concepts or processes may not be repeated in some embodiments.

FIG. 1 is a schematic structural diagram I of a power supply circuit with an adjustable channel switch impedance in an embodiment of the present invention.

Referring to FIG. 1, a power supply circuit with an adjustable channel switch impedance includes N main channel MOS transistors 1, a control module 2, an execution module 3 and a detection module 4, where N is an integer greater than or equal to 1; the execution module 3 includes a first MOS transistor 31; and the detection module 4 includes a detection resistor Rload and a second MOS transistor 41.

Wherein the main channel may also be characterized as a switch channel, a main switch channel, a main current channel, a main current switch channel, or the like, which may be understood as a channel from a power supply to a load.

The first end of the second MOS transistor 41 and the first ends of the main channel MOS transistors 1 are connected to a first power supply VIN, so that the voltage at the first end of the second MOS transistor 41 may be the same as the voltage at the first ends of the main channel MOS transistors 1; the second ends of the main channel MOS transistors 1 are grounded through a load (Rload), and the second end of the second MOS transistor is directly or indirectly grounded through the detection resistor (Rdet).

The first MOS transistor 31 is directly or indirectly connected between the execution side power supply VDD and the ground. The execution side power supply VDD may be the first power supply VIN, or may alternatively be the second power supply which is different from the first power supply VIN.

Wherein the first MOS transistor 31 may be a PMOS, or may alternatively be an NMOS.

Wherein when the main channel MOS transistors 1 are PMOS, the first ends of the main channel MOS transistors 1 may be sources, accordingly, the second ends of the main channel MOS transistors 1 may be drains, the first end of the second MOS transistor 41 is the source, and the second end of the second MOS transistor 41 is the drain.

Wherein when the main channel MOS transistors 1 are NMOS, the first ends of the main channel MOS transistors 1 may be drains, and accordingly, the second ends of the main channel MOS transistors 1 may be sources, the first end of the second MOS transistor 41 is the drain, and the second end of the second MOS transistor 41 is the source.

In addition, in addition to adopting the PMOS and the NMOS, the aforementioned MOS transistors may also be switch tubes with other similar functions, made by using a gallium nitride or silicon nitride process.

Regardless of the type used, the MOS transistors involved in the embodiments of the present invention meet the following:

the gate of the second MOS transistor 41 and the gates of the main channel MOS transistors 1 are connected to the same circuit position, so that gate potentials of the two (or may be understood as the voltage between the gates and the ground) are the same, the gate potential of the first MOS transistor 31 may also be the same as that of the main channel MOS transistors 1, for example the gates are directly or indirectly connected together; and a gate-source voltage of the main channel MOS transistors 1 and a gate-source voltage of the first MOS transistor 31 are configured to be consistent, and a source-drain voltage of the main channel MOS transistors 1 and a source-drain voltage of the second MOS transistor 41 are consistent.

Wherein the gate-source voltage may be understood as the voltage between the gate and source of the corresponding MOS transistor, and the source-drain voltage may be understood as the voltage between the source and drain of the corresponding MOS transistor.

In addition, there may be one or a plurality of first MOS transistors 31 and one or a plurality of second MOS transistors 41. If there are a plurality of first MOS transistors 31, the plurality of first MOS transistors 31 may be connected in parallel to each other; if there are a plurality of second MOS transistors 41, the plurality of second MOS transistors 41 may be connected in parallel to each other.

Any improved or existing solution in the field that can keep the circuit voltage consistent does not depart from the description of the embodiments of the present invention. For example, the corresponding potential node can be connected to the same circuit unit so that the circuit unit (for example, the second keeping unit described later) is controlled to be consistent. For another example, the corresponding potential nodes may be connected to each other to keep the voltage consistent.

In the embodiments of the present invention, the parameters of the main channel MOS transistors 1, the first MOS transistor 31 and the second MOS transistor 41 are the same; wherein the MOS transistor parameters are the same, and furthermore, when the gate-source voltage is the same, the formed impedance (the impedance between the source and the drain) is the same.

The control module 2 is connected to the detection resistor Rdet, and is specifically the control module 2 is connected to the ungrounded end of the detection resistor Rdet; and in addition, the embodiments of the present invention do not exclude the solution that both ends of the detection resistor Rdet are connected to the control module 2.

In the above solution, it can be guaranteed that the voltage of the detection resistor is matched with the current of the load, so as to determine the load current without connecting the detection resistor to a main channel in series. It can be seen that in the present invention, the detection resistor can be prevented from being arranged in the main channel, so that a heat loss of the main channel is effectively reduced.

In the embodiments of the present invention, the control module 2 is configured to:

detect voltage drop information which can characterize a current of a load at two ends of the detection resistor; and adjust the current between a source and a drain of the first MOS transistor according to the voltage drop information so as to adjust a drain-source voltage of the first MOS transistor, so that the gate-source voltage of the main channel MOS transistors changes accordingly, and the impedance formed by the N main channel MOS transistor is adjusted accordingly; it can also be understood as follows: the source-drain (or drain-source) voltage of the first MOS transistor is adjusted by adjusting the source-drain current of the first MOS transistor, so that the gate-source voltage of the main channel changes to achieve the purpose of adjusting the impedance formed by the N main channel MOS transistors.

The main MOS transistors and the first MOS transistor with the same parameters are configured to have the same gate-source voltage, the control module adjusts the source-drain current of the first MOS transistor to adjust impedance of the first MOS transistor, so that the impedance formed by the N main channel MOS transistors is adjusted; the impedance of the main channel can be adjusted to meet various circuit requirements, for example, switch-off of the main channel, and increase and decrease of the impedance; furthermore, based on a mechanism of main channel impedance adjustment, a condition is avoided that the detection resistor with a fixed resistance value cannot accurately detect when the current is relatively small, thereby facilitating improvement of current detection precision. Furthermore, based on the mechanism of main channel impedance adjustment, the optional solutions of the present invention can be used for achieving effective control on a heat loss of the main channel in addition to switch-off control when over-current occurs, so as to achieve a lower heat loss and keep the voltage of the main channel MOS transistors within a reasonable range to achieve better current detection precision.

Specifically, when adjusting the current between a source and a drain of the first MOS transistor according to the voltage drop information so as to adjust a drain-source voltage of the first MOS transistor, so that the gate-source voltage of the main channel MOS transistors changes accordingly, and the impedance formed by the N main channel MOS transistors is adjusted accordingly, the control module 2 is specifically configured to:

determine a current of the load according to the voltage drop information; and adjust, according to a present current range of the current of the load as well as a corresponding relationship between different current ranges and different impedances of the main channel MOS transistors, the current between the source and the drain of the first MOS transistor, so that the impedance of the main channel MOS transistors is at the impedance corresponding to the present current range.

In one example, for at least part of the corresponding relationship, a smaller lower limit value of the current range means greater impedances of the main channel MOS transistors, and/or, a smaller upper limit value of the current range means greater impedances of the main channel MOS transistors.

The at least part of the corresponding relationship may be, for example, other current ranges that exclude the over-current protection current range referred to below, wherein the upper limit value and the lower limit value in the at least part of the corresponding relationship may be much smaller than the over-current protection point.

It can be seen that in the control process, for different load currents, the impedance can be matched with the load current, so that the voltage of the main channel MOS transistors in the main channel can be in an appropriate range, avoiding use of the detection resistor with a fixed resistance value, which cannot accurately detect when the current is small.

In an example, each current range may include a first current range of 1-10 A, a second current range of 0.1-1 A, and a third current range of 0.010-0.1 A;

the impedance of the main channel MOS transistors corresponding to the first current range (1-10 A) may be, for example, 10 mΩ;

the impedance of the main channel MOS transistors corresponding to the second current range (0.1-1 A) may be, for example, 100 mΩ; and the impedance of the main channel MOS transistors corresponding to the third current range (0.01-0.1 A) may be, for example, 1Ω.

It can be seen that in the above examples, the ratio between the upper limit values of each current range is the same as the ratio of the corresponding impedances, and the ratio between the lower limit values of each current range is the same as the ratio of the corresponding impedances.

In an example, the current range may include the over-current protection current range corresponding to the over-current protection point (for example, greater than the current range of the over-current protection point), and the impedance corresponding to the over-current protection current range may be understood as impedance when the main channel MOS transistors are switched off.

In specific examples, part or all of the above current ranges may be used, or any other current ranges may be used or combined without being limited to the above examples.

Specifically, if the current ranges of the above examples are combined, the main channel may be switched off if the load current is particularly large (i.e. if the load current exceeds the over-current protection point), so that the impedance of the main channel MOS transistors is extremely large; if the load current is very large but it does not exceed the over-current protection point, the impedance of the first MOS transistors can be controlled to be extremely small, so that the voltage drop of the system on the switch channel is extremely small, so as to reduce the heat loss. When the load current gradually decreases, the impedance of the main channel MOS transistors can be gradually increased by adjusting the first MOS transistor, so that the voltage value obtained by the main channel MOS transistors is kept within a reasonable range to ensure the detection accuracy of the load current.

By comparison, some of the prior art, such as the DC fast charge control of certain small-capacity batteries, or the insertion or removal detection applications of certain electrical devices, need to be determined based on a real-time current. If the detection is not accurate, it may lead to poor control or misjudgment of detection, even in the measurement application of a larger current, the current method cannot improve the current measurement accuracy as much as a method that can adjust the current-sensing impedance in multiple levels.

Figure 2:
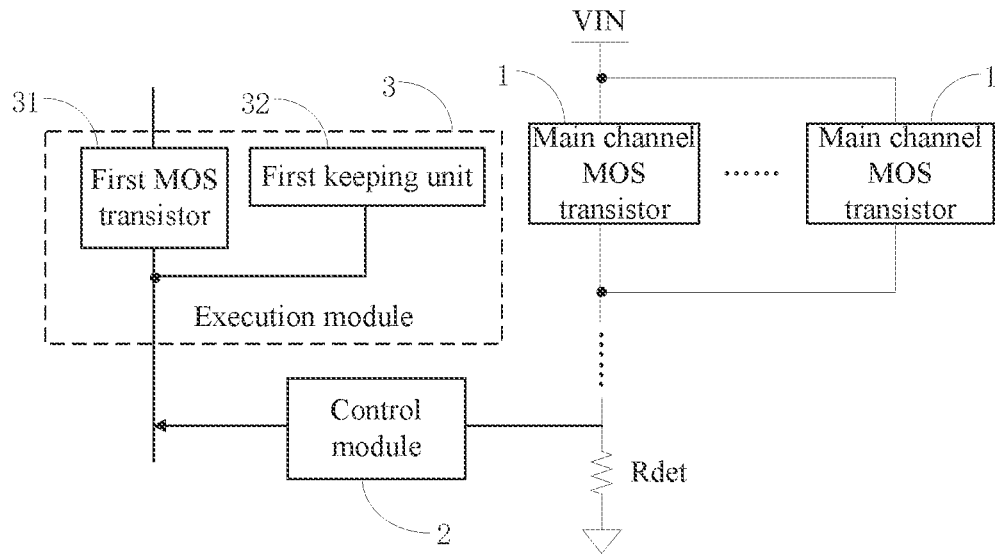
FIG. 2 is a schematic structural diagram II of a power supply circuit with an adjustable channel switch impedance in an embodiment of the present invention.
Figure 3:
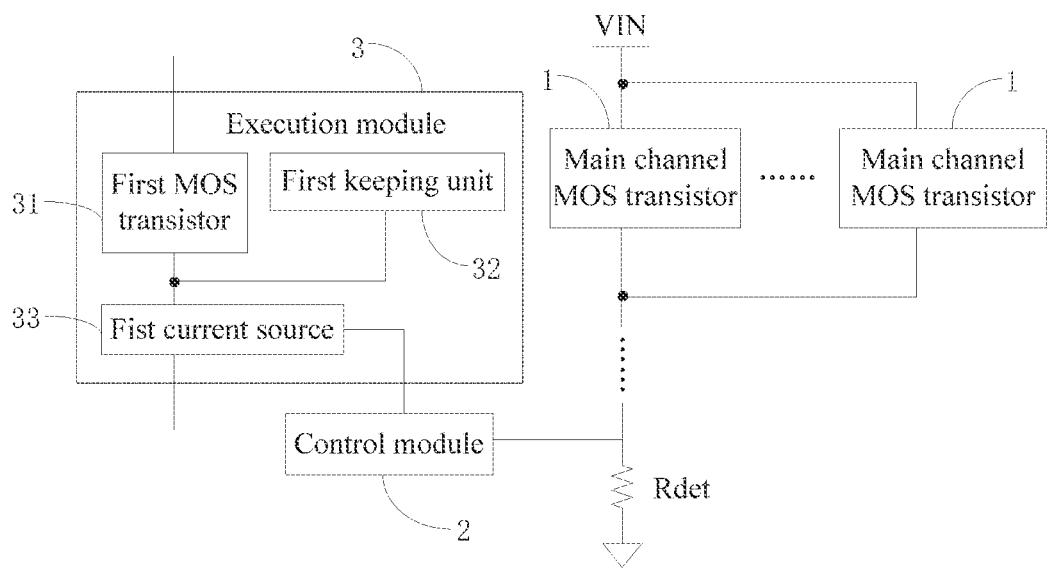
FIG. 3 is a schematic structural diagram III of a power supply circuit with an adjustable channel switch impedance in an embodiment of the present invention.
Figure 4:
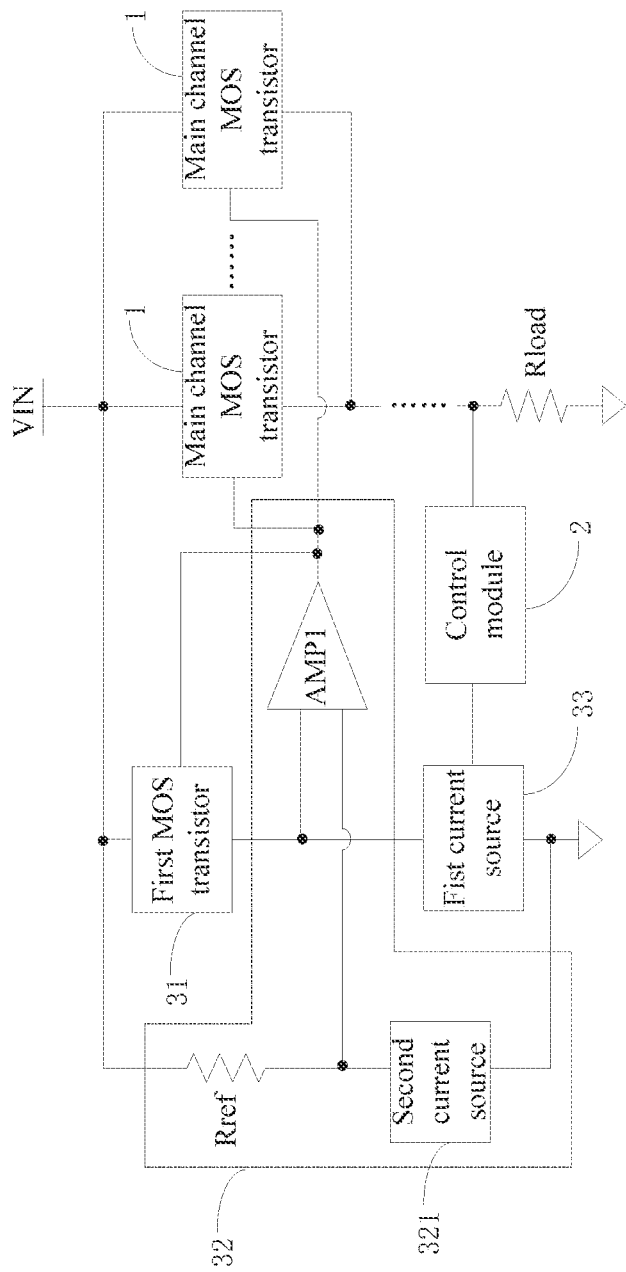
FIG. 4 is a schematic structural diagram IV of a power supply circuit with an adjustable channel switch impedance in an embodiment of the present invention.

FIG. 2 is a schematic structural diagram II of a power supply circuit with an adjustable channel switch impedance in an embodiment of the present invention; FIG. 3 is a schematic structural diagram III of a power supply circuit with an adjustable channel switch impedance in an embodiment of the present invention; and FIG. 4 is a schematic structural diagram IV of a power supply circuit with an adjustable channel switch impedance in an embodiment of the present invention.

In an implementation of the present invention, refer to FIG. 2 and FIG. 3, the execution module 3 further includes a first keeping unit 32 which is also connected to the drain of the first MOS transistor 31 and the first keeping unit 32 is configured to control the drain of the first MOS transistor 31 to be kept at a first reference voltage.

Wherein the first keeping unit 32 may be any existing or improved circuit unit capable of keeping the drain voltage of the first MOS transistor 31.

The first reference voltage may be any preset or adjustable voltage.

It can be seen that to control the current of the first MOS transistor 31, in a solution, the current of a circuit where it is located can be directly adjusted, and in another solution, the current can be controlled by adjusting the voltage at a certain position in the circuit. For example, since the source and drain impedance of the first MOS transistor is related to its current and voltage, the current between the source and drain of the first MOS transistor 31 can also be adjusted by adjusting the first reference voltage, that is, when the control module adjusts the current between the source and the drain of the first MOS transistor, it is specifically used to adjust the first reference voltage. In other examples, it can also be achieved by adjusting the voltage at other locations in the circuit.

In one embodiment, to directly adjust the current of the line, referring to FIG. 3, the first keeping unit 3 includes a first current source 33.

The first current source 33 is connected between the execution side power supply VDD and the ground after being connected to the first MOS transistor 31 in series, and the first current source 33 is further connected to the drain of the first MOS transistor 31; and the control end of the first current source is further connected to the control module 2.

Based on the circuit structure, the control module 2 is specially configured to adjust a current of the first current source 33 when adjusting a current between the source and the drain of the first MOS transistor 31.

Wherein, the connection position of the first current source 33 can be changed accordingly, according to the different type of the first MOS transistor 31. For example, when the first MOS transistor 31 adopts a PMOS, the first current source may be connected between the drain of the first MOS transistor 31 and the ground; when the first MOS transistor 31 adopts an NMOS, the first current source may be understood between the drain of the first MOS transistor 31 and the execution side power supply VDD. In addition, in the circuit, other devices can be connected in series or in parallel. The scope of the above solution is not deviated as long as the current changes of the first current source 33 can cause the impedance of the first MOS transistor 31 to change.

Figure 5:
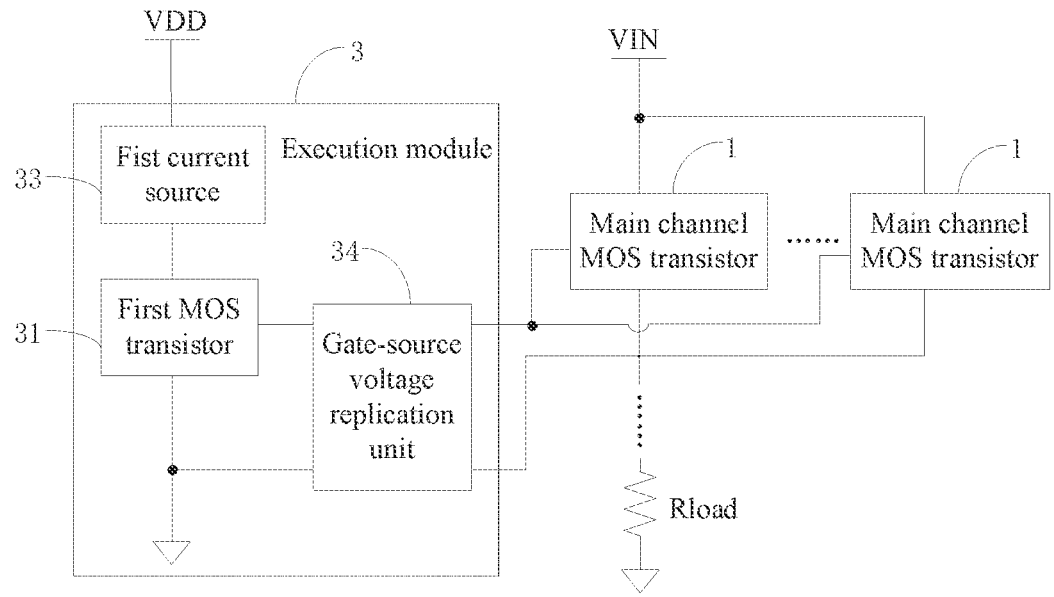
FIG. 5 is a schematic structural diagram V of a power supply circuit with an adjustable channel switch impedance in an embodiment of the present invention.

Refer to FIG. 4 and FIG. 5, in one embodiment, the first keeping unit 32 includes a first operational amplifier AMP1, the first input end of which is connected to the drain of the first MOS transistor 31, and the second input end of the first operational amplifier AMP1 is accessed into the first reference voltage; the output end of the first operational amplifier AMP1 is connected to the drain of the first MOS transistor 31, so as to keep the voltage of the drain of the first MOS transistor at the first reference voltage through control on the first MOS transistor 31.

Wherein, the first input end of the first operational amplifier AMP1 can be, for example, a positive-phase end, the second input end can be, for example, a negative-phase end; in other examples, the first input end can also be a negative-phase end and the second input end can also be a positive-phase end.

In the specific process, refer to FIG. 4, the first keeping unit 33 further includes a second current source 321 and a reference resistor Rref; the second current source 321 is connected between the execution side power supply and the ground after being connected to the reference resistor Rref in series; and the second input end of the first operational amplifier AMP1 is connected between the second current source 321 and the reference resistor Rref, so as to acquire a voltage between the second current source 321 and the reference resistor Rref as the first reference voltage.

When adjusting the first reference voltage, the control module 2 is specifically configured to adjust one of the following:

a resistance value of the reference resistor Rref;

a current of the second current source 321; and the voltage (namely the voltage between the potential and the ground) of the potential between the second current source 321 and the reference resistor 32.

It can be seen that the above solution uses the voltage division of the second current source 321 and the reference resistor Rref to provide the first reference voltage. Furthermore, based on the circuit shown in FIG. 4, any of the above methods can be used to adjust the first reference voltage.

In other embodiments, if other methods are used to provide the first reference voltage, the method of adjusting the first reference voltage can also be changed accordingly. For example, if the voltage division of two or more resistors is used to provide the first reference voltage, the resistance value or voltage of any at least one resistor used for voltage division can also be adjusted to adjust the first reference voltage.

No matter what method is used to provide the first reference voltage, no matter what method is used to adjust the first reference voltage, or whether to adjust the first reference voltage, it does not depart from the description of the embodiments of the present invention.

In addition, the above method of providing the first reference voltage can be applied to the solution that the first MOS transistor 31 uses PMOS, and the solution that the first MOS transistor 31 uses NMOS.

In one embodiment, the corresponding gates and/or sources may be connected together, in order to keep the gate-source voltage of the first MOS transistor 31 consistent with the gate-source voltage of the main channel MOS transistors 1, Furthermore, in the case where the gate of the first MOS transistor 31 and the gates of the main channel MOS transistors 1 are connected together, In a specific solution, the source of the first MOS transistor 31 and the sources of the main channel MOS transistors 1 may be connected together, so that the gate-source voltages of both of them (first MOS transistor 31 and main channel MOS transistors 1) is kept to be consistent.

Taking the first MOS transistor 31 and the main channel MOS transistors 1 both using PMOS as an example, the execution side power supply VDD can be the first power supply, and the drain of the first MOS transistor 31 is directly or indirectly grounded (for example, grounded via the first current source), the first ends of the main channel MOS transistors 1 are the sources of the main channel MOS transistors 1, and the second ends of the main channel MOS transistors 1 are the drains of the main channel MOS transistors 1.

In the case of the first MOS transistor 31 and the main channel MOS transistors 1 using NMOS, the source of the first MOS transistor 31 and the sources of the main channel MOS transistors 1 may be connected together, so that the gate-source voltages of the two are kept consistent. In another specific solution, the structure shown in FIG. 5 can be used to keep the gate-source voltage of the first MOS transistor 31 consistent with the gate-source voltage of the main channel MOS transistors 1.

FIG. 5 is a schematic structural diagram V of a power supply circuit with an adjustable channel switch impedance in an embodiment of the present invention.

Refer to FIG. 5, the execution module 3 further includes a source-grate voltage replication unit 34. The gate-source voltage replication unit 34 can also be represented as: VGS Copy.

The two ends of the first side of the gate-source voltage replication unit 34 are connected to the source and the gate of the first MOS transistor 31 respectively, and the voltage at the two ends of the second side of the gate-source voltage replication unit 34 is consistent with the gate-source voltage of the main channel MOS transistors; specifically, they can be connected together in a direct connection mode, or can be achieved by a reset unit (for example, the second reset unit mentioned later).

the gate-source voltage replicating unit 34 is configured such that the voltage at the two ends of the first side of the gate-source voltage replicating unit 34 can be consistent with the voltage at the two ends of the second side thereof, so that the gate-source voltage of the first MOS transistor 31 is consistent with the gate-source voltage of the main channel MOS transistors 1.

The aforementioned gate-source voltage replication unit 34 may be any existing or improved circuit unit that can keep the voltage difference between the two ends of the first side consistent with the voltage difference between the two ends of the second side.

It can be seen that no matter what method is used to keep the source-gate voltages of the first MOS transistor 31 and the main channel MOS transistors 1 consistent, it does not depart from the scope of the embodiments of the present invention.

Figure 6:
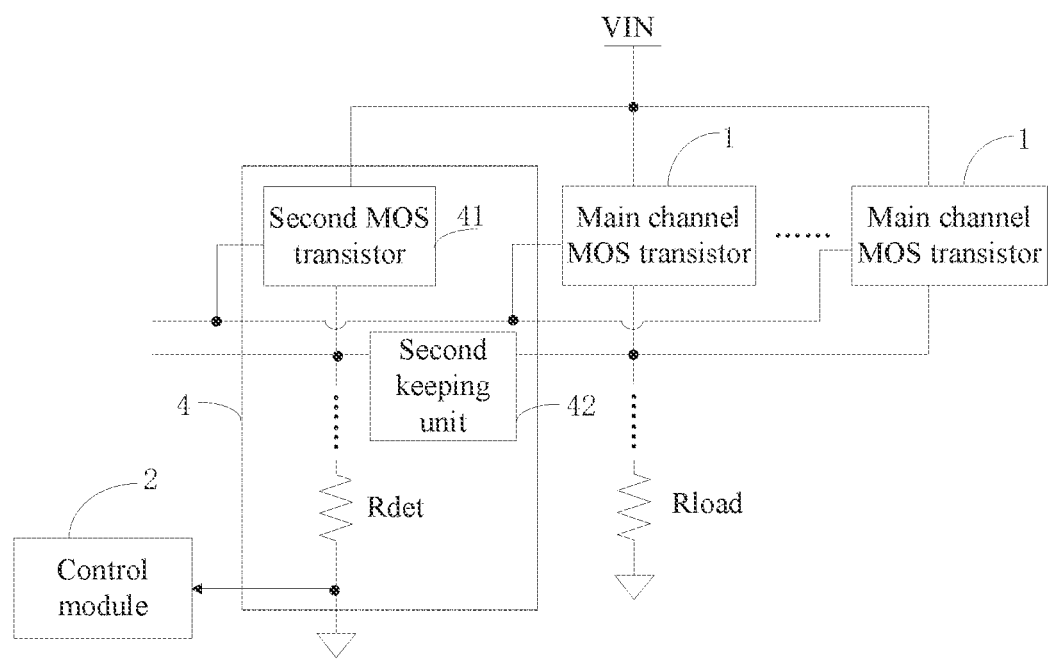
FIG. 6 is a schematic structural diagram VI of a power supply circuit with an adjustable channel switch impedance in an embodiment of the present invention.
Figure 7:
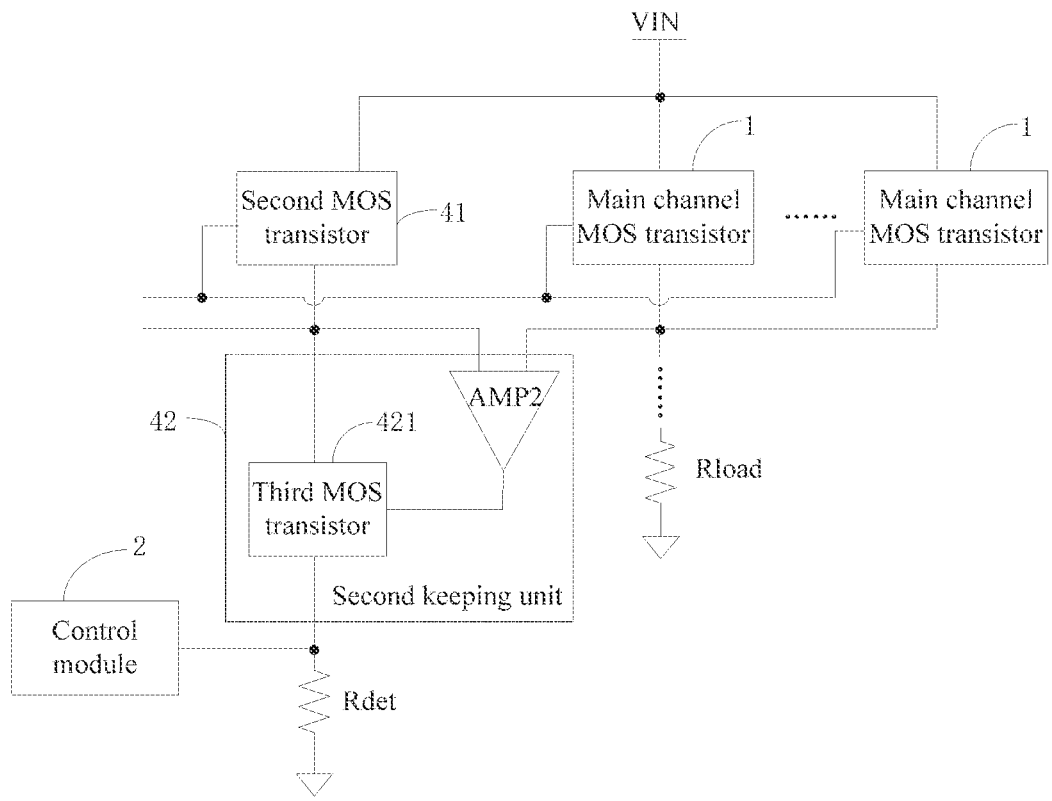
FIG. 7 is a schematic structural diagram VII of a power supply circuit with an adjustable channel switch impedance in an embodiment of the present invention.

FIG. 6 is a schematic structural diagram III of a power supply circuit with an adjustable channel switch impedance in an embodiment of the present invention; and FIG. 7 is a schematic structural diagram IV of a power supply circuit with an adjustable channel switch impedance in an embodiment of the present invention.

Refer to FIG. 6, the detection module 4 further includes a second keeping unit 42.

The second keeping unit 42 is configured to control the voltage at the second end of the second MOS transistor 41 to be consistent with the voltage at the second ends of the main channel MOS transistors 1.

wherein the second keeping unit 42 may adopt a circuit structure similar to that of the first keeping unit 32, or may adopt another circuit structure different from it.

Specifically, refer to FIG. 7, the second keeping unit 42 includes a second operational amplifier AMP2 and a third MOS transistor 421.

When the third MOS transistor 421 uses PMOS, the third MOS transistor 421 is connected between the second end of the second MOS transistor 41 and the detection resistor Rdet in series; when the third MOS transistor 421 uses NMOS, the third MOS transistors 421 is connected between the detection resistor Rdet and ground in series.

the two input ends of the second operational amplifier AMP2 are connected to the second end of the second MOS transistor 41 and the second ends of the main channel MOS transistors respectively; the output end of the second operational amplifier AMP2 is connected to the gate of the third MOS transistor 421, so as to keep the voltage at the second end of the second MOS transistor 41 consistent with the voltage at the second ends of the main channel MOS transistors 1 through control on the third MOS transistor 421.

At the same time, when the first MOS transistor adopts NMOS, the circuit structure shown in FIG. 7 is combined with the circuit structure shown in FIG. 5, then: the second side of the gate-source voltage replication unit 34 is also connected to the gate of the second MOS transistor 41 and the second end, so that the second keeping unit 42 keeps the voltage at the second end of the second MOS transistor 41 to be consistent with the voltage at the second ends of the main channel MOS transistors 1, the voltage between the gates of the main channel MOS transistors 1 and the second end to be consistent with the voltage between the two ends of the second side of the gate-source voltage replication unit 34, thereby enabling the gate-source voltage of the first MOS transistor 31, the gate-source voltage of the main channel MOS transistors 1, and the gate-source voltage of the second MOS transistor 41 to be kept consistent.

In addition, the third MOS transistor 421 may be a PMOS or an NMOS. Correspondingly, when different MOS transistors are used, the connection positions of the two input ends of the second operational amplifier may be opposite.

Figure 8:
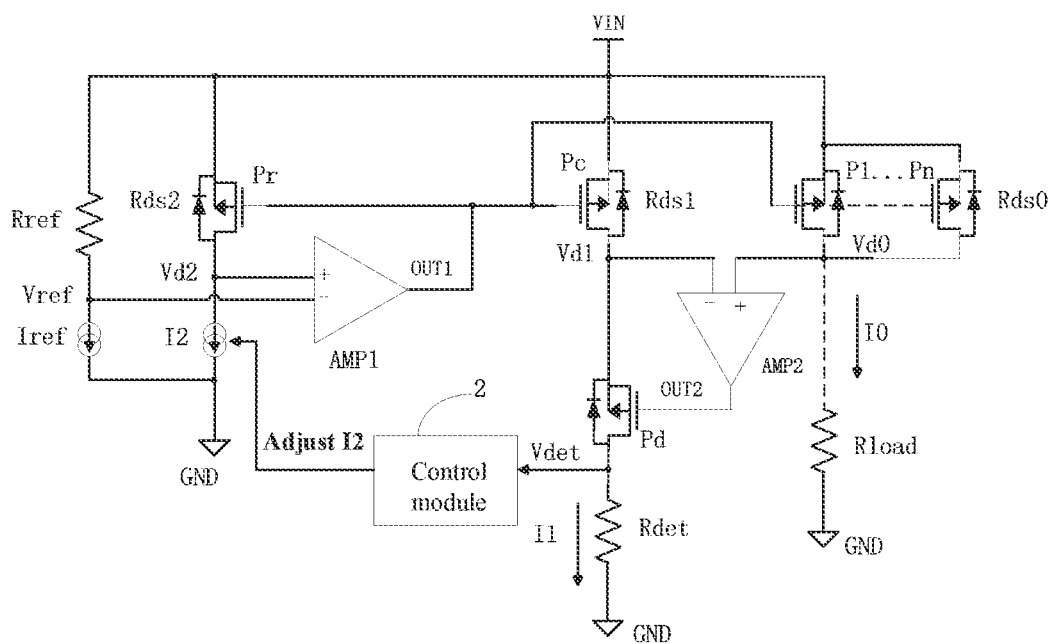
FIG. 8 is a schematic diagram I of a power supply circuit with an adjustable channel switch impedance in an embodiment of the present invention.
Figure 9:
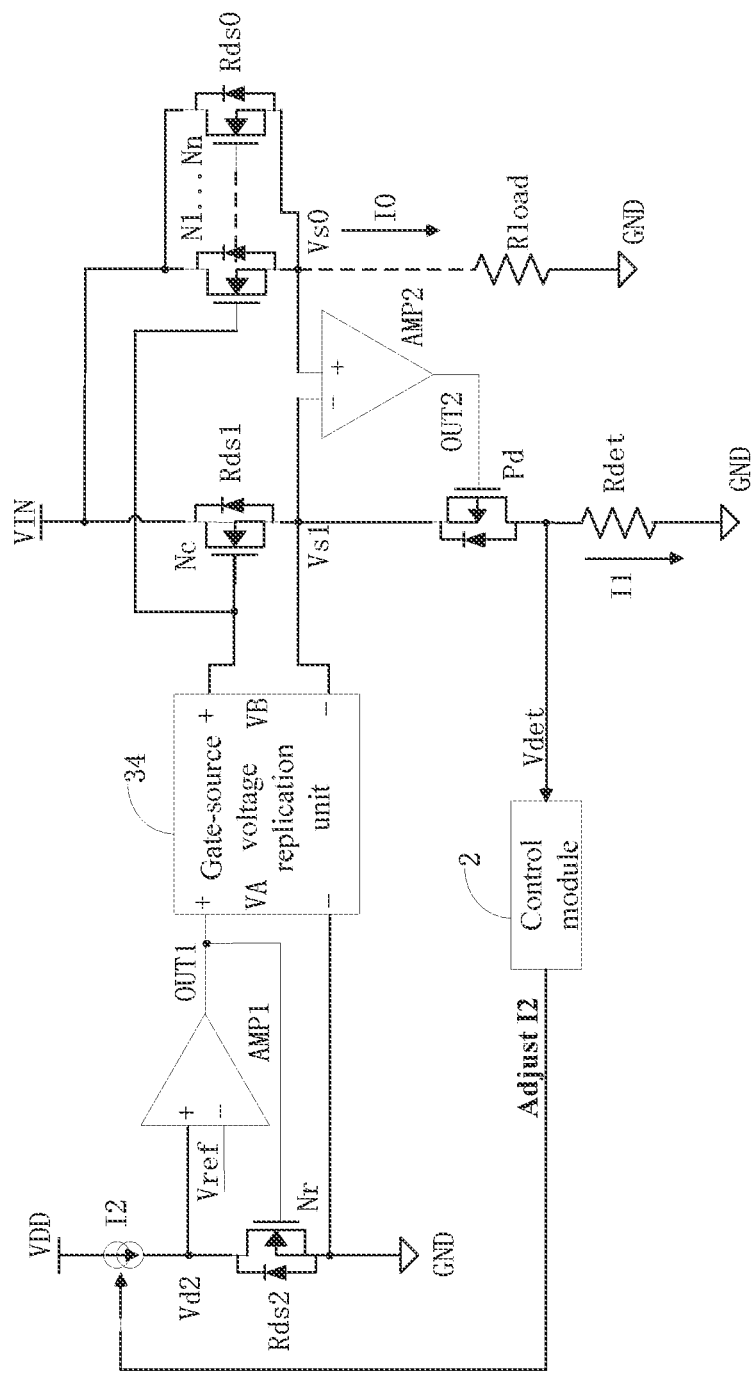
FIG. 9 is a schematic structural diagram II of a power supply circuit with an adjustable channel switch impedance in an embodiment of the present invention.

By combining the above-mentioned solutions, a specific solution (as shown in FIG. 8 below) in which the main channel MOS transistors, the first MOS transistor and the second MOS transistor adopt PMOS can be formed, as well as another specific solution (as shown in FIG. 9 below) in which the main channel MOS transistors, the first MOS transistor and the second MOS transistor adopt PMOS can be formed.

FIG. 8 is a schematic structural diagram I of a power supply circuit with an adjustable channel switch impedance in an embodiment of the present invention; and FIG. 9 is a schematic structural diagram II of a power supply circuit with an adjustable channel switch impedance in an embodiment of the present invention.

For the Physical Quantity:

The current of the load can be represented as T0, the current of the detection resistor Rdet can be represented as I1, the output voltage of the first operational amplifier AMP1 can be represented as OUT1, and the output voltage of the second operational amplifier AMP2 can be represented as OUT2; the current of the second current source 321 can be represented as Iref, the current of the first current source 33 can be represented as I2; the source-drain impedance of the first MOS transistor is represented as Rds2, the source-drain impedance of the second MOS transistor is represented as Rds1, the source-drain impedance of the main channel MOS transistors is represented as Rds, the impedance of N main channel MOS transistors connected in parallel is represented as Rds0, the drain voltage of the first MOS transistor is represented as Vd2, the drain voltage of the second MOS transistor is represented as Vd1, and the drain voltage of the main channel MOS transistors is represented as Vd0. At the same time, reference signs of the reference resistor Rref, the detection resistor Rdet, and load Rload can also be used to represent their resistance values.

Referring to FIG. 8, the main channel MOS transistors, the first MOS transistor and the second MOS transistor adopt PMOS. Therefore, the first MOS transistor can be represented as Pr, the second MOS transistor can be represented as Pc, the main channel MOS transistors can be represented P1, . . . , Pn, and the third MOS transistor can be represented as Pd.

The main channel MOS transistors P1 to Pn (namely, N identical PMOS) are connected in parallel to form the main current channel with impedance being set to Rds0, where N is an integer greater than or equal to 1, then:

$$Rds0=Rds/N.$$

Since the first MOS transistor Pr is the same as the above-mentioned PMOS transistors, then:

$$Rds2=Rds=N*Rds0.$$

Wherein the current can be the first current source of I2, the current can be the second current source of Iref, the resistor Rref and the first operational amplifier AMP1 can be combined to form a general circuit of the execution module 4 that adjusts the main current channel switch impedance to be Rds0.

The control module 2 can perform judgment calculation based on the obtained voltage Vdet of the detection resistor Rdet, and then adjust the current I2 of the first current source. In FIG. 8, the arrow indicating line of Adjust I2 is used to indicate that the control module can adjust the first current source.

According to the working characteristics of the operational amplifier circuit, after the circuit is adjusted and balanced, there are: Vd2=Vref, and because Vd2=VIN-I2*Rds2, Vref=VIN-Iref*Rref, so:

$$I2*Rds2=Iref*Rref.$$

Considering that the output voltage OUT1 of the first operational amplifier AMP1 drives the gate of the first MOS transistor Pr, and also drives each gate of the N parallel main channel MOS transistors P1 to Pn, the source ends of these PMOS are connected to the first power supply VIN; and at the same time, the first MOS transistor Pr in FIG. 8 and the N PMOS of the main current channel are ensured to have the same parameters, then Rds2=N*Rds0 is combined with the formula I2*Rds2=Iref*Rref, it can obtain:

$$Rds0=Iref*Rref/(I2*N).$$

For the sake of simplicity, in the design, N can be fixed after choosing an appropriate value, and the reference resistor Rref and the current Iref of the second current source can also be fixed after choosing an appropriate value, then the control module can adjust Rds0 by adjusting I2, namely: the adjustment of the impedance of the main current switch channel is achieved.

For the detection module 4, the control module 2 can decide how to adjust the value of I2 according to the voltage of Vdet in FIG. 8.

In FIG. 8, the second MOS transistor Pc, the second operational amplifier AMP2, the third MOS transistor Pd, and the main channel MOS transistors P1 to Pn connected in parallel form a mirror circuit. According to the working characteristics of the second operational amplifier AMP2, there is Vd0=Vd1 if the circuit works stably, and the source-drain voltage of the second MOS transistor Pc is VIN-Vd1, denoted as VSD1, and the source and drain voltages of P1 to Pn are all VIN-Vd0, denoted as VSD0, then it can obtain VSD0=VIN-Vd0=VSD1=VIN-Vd1, that is, the source and drain voltages of the two are equal, and the gate-source voltage VGS of both are OUT1-VIN. At the same time, it is ensured that parameters of the PMOS transistor Pc in FIG. 2 and the N PMOS transistors of the main current channel are consistent, if the two gate-source voltages are the same, there are Rds1=Rds and Rds0=Rds/N, that is:

$$Rds1=N*Rds0.$$

The source and drain voltages of the two are equal, that is, VSD1=VSD0, and: VSD0=I0*Rds0, VSD1=I1*Rds1, therefore, I0=N*I1 can be obtained;

and because there is Vdet=I1*Rdet (wherein Rdet can choose a suitable resistance value to be fixed), it can obtain:

$$I0=N*Vdet/Rdet.$$

Therefore, after the control module 2 detects Vdet, it can obtain the current value of the main current channel, that is, I0, through the equation I0=N*Vdet/Rdet.

It can be seen that by combining: Rds0=Iref*Rref/(I2*N) with I0=N*Vdet/Rdet, the control module 2 can adjust the magnitude of I2 according to the magnitude of I0 obtained, wherein the conversion or judgment logic from I0 to I2 can be determined according to actual needs, and then the impedance Rds0 of the main current switch channel can be adjusted.

In an example, when I0 is 1-10 A, I2 can be adjusted to a certain value such that Rds0=10 mΩ, when I0 is 0.1-1 A, a certain value of I2 can be adjusted such that Rds0=100 mΩ, and when I0 is 0.01-0.1 A, a certain value of I2 can be adjusted such that Rds0=1Ω, and so on. According to reasonable requirements, the switch impedance Rds0 of the main current channel can be adjusted appropriately according to the current value I0 passed at the time, so that VSD0 is always within a suitable voltage value range during normal current detection work, the detection accuracy of the current I0 in a larger working range is improved.

Refer to FIG. 9, the main channel MOS transistors, the first MOS transistor and the second MOS transistor adopt NMOS, wherein the first MOS transistor can be represented as Nr, the second MOS transistor can be represented as Nc, the main channel MOS transistors can be represented N1, . . . , Nn; if the third MOS transistor adopts PMOS, it can be represented as Pd. If the third MOS transistor adopts NMOS, it can also be represented as Nd.

Refer to FIG. 9, most of the content of the circuit structure can be understood by referring to FIG. 8 and comprehensively considering the difference between PMOS and NMOS. Therefore, the following emphasizes the difference between FIG. 9 and FIG. 8.

Taking into account the characteristics of the NMOS gate drive, FIG. 9 adds a gate-source voltage replication unit 34 to ensure that the gate-source drive voltage of the first MOS transistor Nr is VGS and gate-source driving voltage of the second MOS transistor Nc and gate-source driving voltage of the main channel MOS transistors N1 to Nn can be kept consistent. The first reference voltage of the negative-phase end of the first operational amplifier AMP1 in FIG. 9 is no longer provided by the circuit composed of the second current source and the reference resistor Rref shown in FIG. 2, but directly provided by the voltage source Vref. Certainly, in other examples, a circuit composed of the second current source and the reference resistor Rref can also be used to provide it.

In the circuit shown in FIG. 9, Rds2=Rds1=N*Rds0; I0=N*I1, and Vref=I2*Rds2, therefore Rds0=Vref/(I2*N).

In addition, since there are Vdet=I1*Rdet and I0=N*Vdet/Rdet, the control module 2 can obtain I0 according to the measured Vdet, and the predetermined N and Rdet, and make a suitable decision to control the adjustment of I2 to make Rds0 change to meet application requirements according to the current of I0, for example:

When the I0 is particularly large (i.e., when I0 exceeds the over-current protection point), the main current channel can be switched off, so that Rds0 is extremely large; when the I0 is very large but it does not exceed the over-current protection point, I2 can be adjusted, so that the voltage drop of the system on the switch channel is extremely small, reducing the heat loss. When the I0 gradually becomes smaller, the Rds0 can be gradually increased by adjusting I2 so that the voltage value obtained by I0*Rds0 is kept within a reasonable range to ensure the detection accuracy of the I0 current.

It can be seen that in the above scheme:

by adjusting the execution module of the main current switch channel impedance, that is, by constructing a MOS transistor that is the same as each MOS transistor of the main current switch channel, this MOS transistor and the MOS of the main current switch channel are ensured to always use the same gate-source driving voltage (VGS);

the circuit for adjusting the gate source drive voltage of the main current switch channel MOS transistors is achieved by adjusting the first current source (i.e. the current source with current I2), and the impedance of the main current switch channel is adjusted through this circuit.

Finally, it should be noted that the above embodiments are only used to illustrate the technical solutions of the present invention, but not to limit them; although the present invention has been described in detail with reference to the aforementioned embodiments, those of ordinary skill in the art should understand: it is still possible to modify the technical solutions described in the aforementioned embodiments, or equivalently replace some or all of the technical features; and these modifications or replacements do not make the essence of the corresponding technical solutions deviate from the range of the technical solutions of the embodiments of the present invention.

The invention claimed is:

1. A power supply circuit with an adjustable channel switch impedance, comprising N main channel MOS transistors, a control module, an execution module and a detection module, wherein the N is an integer greater than or equal to 1; the execution module comprises a first MOS transistor; the detection module comprises a detection resistor and a second MOS transistor;

both the first end of the second MOS transistor and the first ends of the main channel MOS transistors are connected to a first power supply, and the second ends of the main channel MOS transistors are grounded through a load; the second end of the second MOS transistor is directly or indirectly grounded through the detection resistor; a gate of the second MOS transistor and gates of the main channel MOS transistors are connected to the same circuit position, the first MOS transistor is directly or indirectly connected between an execution side power supply and the ground, and the execution side power supply is a first power supply or a second power supply that is different from the first power supply;

a gate-source voltage of the main channel MOS transistors and a gate-source voltage of first MOS transistor are configured to be consistent, and a source-drain voltage of the main channel MOS transistors and a source-drain voltage of the second MOS transistor are consistent, and parameters of the main channel MOS transistors, the first MOS transistor and the second MOS transistor are the same;

the control module is connected to the detection resistor and configured to:

detect voltage drop information on a voltage drop at two ends of the detection resistor, wherein the voltage drop information can represent a current of a load; and adjust the current between a source and a drain of the first MOS transistor according to the voltage drop information so as to adjust a drain-source voltage of the first MOS transistor, so that the gate-source voltage of the main channel MOS transistors changes accordingly, and the impedance formed by the N main channel MOS transistors is adjusted accordingly.

2. The power supply circuit with an adjustable channel switch impedance according to claim 1, wherein the execution module further comprises a first keeping unit which is connected to the drain of the first MOS transistor and the first keeping unit is configured to:
control the drain of the first MOS transistor to be kept at a first reference voltage.

3. The power supply circuit with an adjustable channel switch impedance according to claim 2, wherein the first keeping unit comprises a first current source;
the first current source is connected between the execution side power supply and the ground after the first current source being connected to the first MOS transistor in series, and the first current source is connected to the drain of the first MOS transistor; and the control end of the first current source is further connected to the control module; and
the control module is specially configured to adjust a current of the first current source when the control module adjusting a current between the source and the drain of the first MOS transistor.

4. The power supply circuit with an adjustable channel switch impedance according to claim 2, wherein the first keeping unit comprises a first operational amplifier, the first input end of the first operational amplifier is connected to the drain of the first MOS transistor, and the second input end of the first operational amplifier is accessed into the first reference voltage; and the output end of the first operational amplifier is connected to the gate of the first MOS transistor, so as to keep the voltage of the drain of the first MOS transistor at the first reference voltage through control on the first MOS transistor.

5. The power supply circuit with an adjustable channel switch impedance according to claim 4, wherein the first keeping unit further comprises a second current source and a reference resistor; the second current source is connected between the execution side power supply and the ground after being connected to the reference resistor in series; and the second input end of the first operational amplifier is connected between the second current source and the reference resistor, so as to acquire a voltage of a potential between the second current source and the reference resistor as the first reference voltage.

6. The power supply circuit with an adjustable channel switch impedance according to claim 2, wherein the control module is specially configured to adjust the first reference voltage when the control module adjusting a current between the source and the drain of the first MOS transistor.

7. The power supply circuit with an adjustable channel switch impedance according to claim 1, wherein the main channel MOS transistors and the first MOS transistor are PMOS, the execution side power supply is the first power supply, the drain of the first MOS transistor is directly or indirectly grounded, the first ends of the main channel MOS transistors are sources of the main channel MOS transistors, and the second ends of the main channel MOS transistors are drains of the main channel MOS transistors.

8. The power supply circuit with an adjustable channel switch impedance according to claim 1, wherein the main channel MOS transistors and the first MOS transistor are NMOS, the first ends of the main channel MOS transistors are drains of the main channel MOS transistors, the second ends of the main channel MOS transistors are sources of the main channel MOS transistors, the drain of the first MOS transistor is connected to the execution side power supply, and the source of the first MOS transistor is directly or indirectly grounded.

9. The power supply circuit with an adjustable channel switch impedance according to claim 1, wherein the execution module further comprises a gate-source voltage replication unit;
the two ends of the first side of the gate-source voltage replication unit are connected to the source and the gate of the first MOS transistor respectively, and the voltage at the two ends of the second side of the gate-source voltage replication unit is consistent with the gate-source voltage of the main channel MOS transistors;
the gate-source voltage replication unit is configured such that the voltage at the two ends of the first side of the gate-source voltage replication unit is consistent with the voltage at the two ends of the second side of the gate-source voltage replication unit, so that the gate-source voltage of the first MOS transistor is consistent with the gate-source voltage of the main channel MOS transistors.

10. The power supply circuit with an adjustable channel switch impedance according to claim 1, wherein the detection module further comprises a second keeping unit; and
the second keeping unit is configured to control the voltage at the second end of the second MOS transistor to be consistent with the voltage at the second ends of the main channel MOS transistors.

11. The power supply circuit with an adjustable channel switch impedance according to claim 10, wherein the second keeping unit comprises a second operational amplifier and a third MOS transistor; and
the third MOS transistor is connected between the second end of the second MOS transistor and the detection resistor in series or between the detection resistor and the ground in series; the two input ends of the second operational amplifier are connected to the second end of the second MOS transistor and the second ends of the main channel MOS transistors respectively; the output end of the second operational amplifier is connected to the gate of the third MOS transistor, so as to keep the voltage at the second end of the second MOS transistor consistent with the voltage at the second ends of the main channel MOS transistors through control on the third MOS transistor.

12. The power supply circuit with an adjustable channel switch impedance according to claim 1, wherein when the control module adjusting the current between a source and a drain of the first MOS transistor according to the voltage drop information so as to adjust a drain-source voltage of the first MOS transistor, so that the gate-source voltage of the main channel MOS transistors changes accordingly, and the impedance formed by the N main channel MOS transistors is adjusted accordingly, the control module is specifically configured to:
determine a current of the load according to the voltage drop information; and
adjust, according to a present current range of the current of the load as well as a corresponding relationship between different current ranges and different impedances of the main channel MOS transistors, the current between the source and the drain of the first MOS transistor, so that the impedance of the main channel MOS transistors is at the impedance corresponding to the present current range; and the corresponding relationship meets at least one of the
following:
the impedances of the main channel MOS transistors
corresponding to an over-current protection current
range are impedances when the main channel MOS
transistors are switched off, and the over-current protection current range refers to a current range greater
than an over-current protection point;
for at least part of the current range, a smaller lower limit
value of the current range means greater impedances of
the main channel MOS transistors; and
for at least part of the current range, a smaller upper limit
value of the current range means greater impedances of
the main channel MOS transistors.

13. An electronic device, comprising the power supply circuit with an adjustable channel switch impedance according to claim 1.

14. The power supply circuit with an adjustable channel switch impedance according to claim 2, wherein the main channel MOS transistors and the first MOS transistor are PMOS, the execution side power supply is the first power supply, the drain of the first MOS transistor is directly or indirectly grounded, the first ends of the main channel MOS transistors are sources of the main channel MOS transistors, and the second ends of the main channel MOS transistors are drains of the main channel MOS transistors.

15. The power supply circuit with an adjustable channel switch impedance according to claim 3, wherein the main channel MOS transistors and the first MOS transistor are PMOS, the execution side power supply is the first power supply, the drain of the first MOS transistor is directly or indirectly grounded, the first ends of the main channel MOS transistors are sources of the main channel MOS transistors, and the second ends of the main channel MOS transistors are drains of the main channel MOS transistors.

16. The power supply circuit with an adjustable channel switch impedance according to-claim 2, wherein the main channel MOS transistors and the first MOS transistor are NMOS, the first ends of the main channel MOS transistors are drains of the main channel MOS transistors, the second ends of the main channel MOS transistors are sources of the main channel MOS transistors, the drain of the first MOS transistor is connected to the execution side power supply, and the source of the first MOS transistor is directly or indirectly grounded.

17. The power supply circuit with an adjustable channel switch impedance according to-claim 3, wherein the main channel MOS transistors and the first MOS transistor are NMOS, the first ends of the main channel MOS transistors are drains of the main channel MOS transistors, the second ends of the main channel MOS transistors are sources of the main channel MOS transistors, the drain of the first MOS transistor is connected to the execution side power supply, and the source of the first MOS transistor is directly or indirectly grounded.

18. The power supply circuit with an adjustable channel switch impedance according to claim 2, wherein the execution module further comprises a gate-source voltage replication unit;
the two ends of the first side of the gate-source voltage
replication unit are connected to the source and the gate
of the first MOS transistor respectively, and the voltage
at the two ends of the second side of the gate-source
voltage replication unit is consistent with the gate-source voltage of the main channel MOS transistors;
the gate-source voltage replication unit is configured such
that the voltage at the two ends of the first side of the
gate-source voltage replication unit is consistent with
the voltage at the two ends of the second side of the
gate-source voltage replication unit, so that the gate-source voltage of the first MOS transistor is consistent
with the gate-source voltage of the main channel MOS
transistors.

19. The power supply circuit with an adjustable channel switch impedance according to claim 2, wherein the detection module further comprises a second keeping unit; and
the second keeping unit is configured to control the
voltage at the second end of the second MOS transistor
to be consistent with the voltage at the second ends of
the main channel MOS transistors.

20. The power supply circuit with an adjustable channel switch impedance according to claim 2, wherein when the control module adjusting the current between a source and a drain of the first MOS transistor according to the voltage drop information so as to adjust a drain-source voltage of the first MOS transistor, so that the gate-source voltage of the main channel MOS transistors changes accordingly, and the impedance formed by the N main channel MOS transistors is adjusted accordingly, the control module is specifically configured to:
determine a current of the load according to the voltage
drop information; and
adjust, according to a present current range of the current
of the load as well as a corresponding relationship
between different current ranges and different impedances of the main channel MOS transistors, the current
between the source and the drain of the first MOS
transistor, so that the impedance of the main channel
MOS transistors is at the impedance corresponding to
the present current range; and
the corresponding relationship meets at least one of the
following:
the impedances of the main channel MOS transistors
corresponding to an over-current protection current
range are impedances when the main channel MOS
transistors are switched off, and the over-current protection current range refers to a current range greater
than an over-current protection point;
for at least part of the current range, a smaller lower limit
value of the current range means greater impedances of
the main channel MOS transistors; and
for at least part of the current range, a smaller upper limit
value of the current range means greater impedances of
the main channel MOS transistors.

\* \* \* \* \*